(12) United States Patent
France et al.

(10) Patent No.: US 10,041,972 B2
(45) Date of Patent: Aug. 7, 2018

(54) TEST BLOCK WITH INPUT AND OUTPUT SOCKETS OF THE RJ45 TYPE

(71) Applicant: ABB SCHWEIZ AG, Baden (CH)

(72) Inventors: Philippe France, Chazelles sur Lyon (FR); Alexandre Chaillet, Lyons (FR)

(73) Assignee: ABB SCHWEIZ AG, Baden (CH)

( * ) Notice: Subject to any disclaimer, the term of this patent is extended or adjusted under 35 U.S.C. 154(b) by 0 days.

(21) Appl. No.: 15/481,839

(22) Filed: Apr. 7, 2017

(65) Prior Publication Data

US 2017/0292972 A1    Oct. 12, 2017

(30) Foreign Application Priority Data

Apr. 8, 2016  (EP) .................................... 16164352

(51) Int. Cl.
*G01R 31/00*    (2006.01)
*G01R 1/04*    (2006.01)
(Continued)

(52) U.S. Cl.
CPC .............. *G01R 1/0408* (2013.01); *G01R 1/18* (2013.01); *G01R 22/061* (2013.01);
(Continued)

(58) Field of Classification Search
CPC ........................... G01R 1/0416; G01R 1/0466; G01R 1/06705; G01R 1/18; G01R 31/2886; G01R 1/203; G01R 15/146; G01R 19/0007
See application file for complete search history.

(56) References Cited

U.S. PATENT DOCUMENTS

| 6,605,937 B2 * | 8/2003 | Germer ................ G01R 22/065 324/156 |
| 2007/0205012 A1 * | 9/2007 | Stachowiak, Jr. ..... G01R 11/04 174/58 |

(Continued)

FOREIGN PATENT DOCUMENTS

EP    1764618 A2    3/2007

OTHER PUBLICATIONS

Abb France: "Gamme ESSAILEC-Blocs d'essais", Jun. 1, 2014; pp. 1-24.
(Continued)

*Primary Examiner* — Tung X Nguyen
(74) *Attorney, Agent, or Firm* — Cantor Colburn LLP

(57) ABSTRACT

The invention relates to a test block intended to be implanted in the circuit connecting an apparatus to be tested such as an electricity meter or a protective relay and a power source supplying the apparatus to be tested such as an intensity sensor and/or a voltage sensor. The test block comprises a base including a plurality of inner electric circuits capable of allowing the transmission of information from the power source to the apparatus to be tested and a protective cover intended to be assembled in a dismountable manner with the base in order to form a closed enclosure in which the inner electric circuits are housed. The base and the protective cover are configured such that the removal of the protective cover gives access to a receiving site delimited by the base and capable of receiving by plugging a test plug independent of the test block and electrically linked to a test equipment, in particular a voltmeter and/or an ammeter and/or a dummy current source. A test appliance is also described.

20 Claims, 3 Drawing Sheets

(51) Int. Cl.
*G01R 1/18* (2006.01)
*G01R 22/06* (2006.01)
*G01R 31/28* (2006.01)
*G01R 35/04* (2006.01)
*H05K 9/00* (2006.01)
*G01R 31/319* (2006.01)
*G01R 31/327* (2006.01)
*H01R 13/66* (2006.01)

(52) U.S. Cl.
CPC ....... *G01R 22/068* (2013.01); *G01R 31/2829* (2013.01); *G01R 31/31905* (2013.01); *G01R 31/327* (2013.01); *G01R 31/3278* (2013.01); *G01R 35/04* (2013.01); *H05K 9/0049* (2013.01); *H01R 13/665* (2013.01); *H01R 2201/20* (2013.01)

(56) References Cited

U.S. PATENT DOCUMENTS

| | | |
|---|---|---|
| 2012/0128078 A1 | 5/2012 | Billingsley et al. |
| 2014/0273657 A1 | 9/2014 | Hashim et al. |
| 2015/0056864 A1 | 2/2015 | Yamamoto et al. |
| 2015/0213291 A1 | 7/2015 | Gut et al. |

OTHER PUBLICATIONS

European Search Report for Application No. EP 16 16 4352.
Written Opinion for Application No. EP 16 16 4352.

\* cited by examiner

US 10,041,972 B2

TEST BLOCK WITH INPUT AND OUTPUT SOCKETS OF THE RJ45 TYPE

CROSS REFERENCE TO RELATED APPLICATIONS

This application claims priority under 35 U.S.C. 119 to the following European Patent Application No. 16164352.3 filed on Apr. 8, 2016, the contents of which are incorporated herein by reference thereto.

BACKGROUND

The present invention concerns a test block intended to be implanted in the circuit connecting an apparatus to be tested, in particular an electricity meter or a protective relay, and a power source, in particular an intensity sensor and/or a voltage sensor, supplying the apparatus to be tested, the test block comprising, on the one hand, a base including a plurality of inner electric circuits capable of allowing the transmission of information from the power source to the apparatus to be tested, on the other hand, a protective cover intended assembled in a dismountable manner with the base in order to form a closed enclosure in which the inner electric circuits are housed, the base and the protective cover being configured such that the removal of the protective cover gives access to a receiving site delimited by the base and capable of receiving by plugging a test plug independent of the test block and electrically linked to a test equipment, in particular a voltmeter and/or an ammeter and/or a dummy current source.

For several decades, it has been known to implant an electric apparatus known as <<test block>> or <<test connector>> in the electric circuit which connects an apparatus to be tested to the power source which supplies the apparatus to be tested. By way of example, the applicant commercializes test blocks of this nature under the trade name <<Essailec>>.

Usually, the power source may comprise a voltage sensor and/or an intensity sensor associated with a determined phase of an electric network while the apparatus to be tested may be an electricity meter or a protective relay intended to control at least one circuit breaker likely to act on said phase in case of overvoltage and/or overcurrent detected by the power source and by the protective relay.

Conventionally, the test block comprises a base and a protective cover removably assembled on the base in order to delimit a closed and sealed enclosure according to the standard IP40 when the cover is fastened on the base. The enclosure encloses and protects a plurality of inner electric circuits independent of each other.

On a rear face and/or on a side face of the base, the test block comprises a plurality of input sockets allowing linking the inner electric circuits to the power source: each input socket is inked to a single determined inner electric circuit and each inner electric circuit is linked to a single input socket. It is necessary to connect a plurality of connectors in the input sockets and themselves linked to the power source by a cable comprising a plurality of independent conductor strands.

The test block also comprises a plurality of output sockets arranged on the rear face and/or on a side face of the base. These output sockets allow linking the inner electric circuits to the apparatus to be tested according to an arrangement in which each output socket is linked to a single inner electric circuit and each inner electric circuit is linked to a single output socket. It is necessary to connect a plurality of connectors in the output sockets and themselves linked to the apparatus to be tested by a cable comprising a plurality of independent conductor strands.

The removal of the protective cover, on the side of the front face of the base, gives access to a receiving site delimited by the base and capable of receiving, by plugging, a test plug independent of the test block and electrically linked to a test equipment. Usually, the test equipment may comprise a voltmeter and/or an ammeter and/or a dummy current source. The plugging of the test plug has the effect of temporarily acting on the state and/or the configuration of all or part of the inner electric circuits in a predetermined manner, directly depending on the design of the test plug, allowing carrying out measuring and/or calibrating operations relatively to the apparatus to be tested via the test equipment. The test plug comprises actuating elements configured to this end capable of appropriately acting on all or part of the inner electric circuits depending on the operation to be carried out.

If the currently implemented solutions are satisfactory in terms of efficiency and robustness, they nevertheless do not give full satisfaction.

First, it is necessary to connect each of the input sockets to the power source and to connect each of the output sockets to the apparatus to be tested. These operations are not convivial in practice and are possibly a source of error.

Moreover, the multiplication of the connection means between the multiple input and output sockets and as many associated connectors, makes the assembly technically complex and perfectible in terms of cost. This also results in an increase in the possible failure factor or in false contacts which directly depend on the number of used pieces.

BRIEF SUMMARY

The present invention aims to solve all or part of the drawbacks listed above.

In this context, there is a need to provide a test block which is simple, robust, easy and convenient to use and cost-effective.

To this end, it is proposed a test block intended to be implanted in the circuit connecting an apparatus to be tested such as an electricity meter or a protective relay and a power source supplying the apparatus to be tested such as an intensity sensor and/or a voltage sensor, the test block comprising:
  a base including a plurality of inner electric circuits capable of allowing the transmission of information from the power source to the apparatus to be tested,
  a protective cover intended to be assembled in a dismountable manner with the base in order to form a closed enclosure in which the inner electric circuits are housed,
  the base and the protective cover being configured such that the removal of the protective cover gives access to a receiving site delimited by the base and capable of receiving by plugging a test plug independent of the test block and electrically linked to a test equipment, in particular a voltmeter and/or an ammeter and/or a dummy current source,
  the base comprising:
    at least one multi-contact type input socket accessible from the outside of the enclosure and whose contacts are respectively electrically linked to the inner electric circuits so that the input socket is connected to all inner electric circuits at the same time, the input socket being configured so as to be able to be connected to a first multi-contact type connector independent of the test block and whose contacts are electrically linked to the power supply, in particular via a multicore cable, and at least one multi-contact type output socket accessible from the outside of the enclosure and whose contacts are respectively electrically linked to the inner electric circuits so that the output socket is connected to all inner electric circuits at the same time, the output socket being configured so as to be able to be connected to a second multi-contact type connector independent of the test block and whose contacts are electrically linked to the apparatus to be tested, in particular via a multicore cable.

According to a particular embodiment, the base and the protective cover comprise electrically conductive elements linked together and configured so as to ensure a continuity and a magnetic shielding closure such as the enclosure delimited by the base and the protective cover is a Faraday cage protecting the inner electric circuits relative to the magnetic fields external to the enclosure delimited by the base and the protective cover.

The base preferably comprises a removable lid whose removal relative to the rest of the base gives access to the inner electric circuits and whose nature and/or shape is adapted to the nature of the input and output sockets.

There is also proposed a test appliance comprising such a test block and a test plug capable of being plugged into the receiving site delimited by the base after removal of the protective cover, the inner electric circuits of the test block and the test plug being configured such that the plugging of the test plug causes a temporary action on all or part of the inner electric circuits of the test block as long as the test plug is plugged, said temporary action being such as it allows carrying out measuring and/or calibrating operations in relation with the apparatus to be tested thanks to the test equipment.

According to a particular embodiment, the test appliance comprises a first multi-contact type connector independent of the test block and of the test plug, complementary to the input socket of the test block so as to be able to be connected to the input socket of the test block and whose contacts are electrically linked to the power source, in particular via a multicore cable, and the input socket of the test block and the first connector are configured such that the electric connection between the inner electric circuits of the test block and the power source results from the action of connecting the first connector with the input socket of the test block.

The test appliance preferably comprises a second multi-contact type connector independent of the test block and of the test plug, complementary to the output socket of the test block so as to be able to be connected to the output socket of the test block and whose contacts are electrically linked to the apparatus to be tested, in particular via a multicore cable, and the output socket of the test block and the second connector are configured such that the electric connection between the inner electric circuits and the apparatus to be tested results from the action of connecting the second connector with the output socket of the test block.

Preferably the test plug comprises, on the one hand, a plurality of actuating elements and a plurality of electric conductors configured so as to act on the inner electric circuits of the base in a manner causing said temporary action as long as the test plug is plugged into the receiving site delimited by the base and, on the other hand, a multi-contact type output socket whose contacts are respectively connected to all or part of the electric conductors of the test plug, the output socket of the test plug being configured so as to be able to be connected to a third multi-contact type connector independent of the test block and of the test plug and whose contacts are electrically linked to the test equipment, in particular via a multicore cable.

The test appliance may be configured such that, when the test plug is plugged into the receiving site delimited by the base, the electric conductors which are connected to the contacts of the output socket of the test plug are electrically linked to all or part of the contacts of the output socket of the base of the test block via all or part of the inner electric circuits.

The output socket of the test plug is in particular formed by a male or female connector of the RJ45 type comprising a pinning with 8 contact positions, each of the pins corresponding to a contact of the output socket of the test plug.

According to a particular embodiment, the test appliance comprises the third multi-contact type connector independent of the test block and of the test plug, complementary to the output socket of the test plug so as to be able to be connected to the output socket of the test plug and whose contacts are electrically linked to the test equipment, in particular via a multicore cable and the output socket of the test plug and the third connector are configured such that the electric connection of the electric conductors of the test plug to the test equipment results from the action of connecting the third connector in the output socket of the test plug.

BRIEF DESCRIPTION OF THE DRAWINGS

The invention will be well understood using the following description of particular embodiments of the invention given by way of non-limiting examples and represented in the appended drawings, in which.

BRIEF DESCRIPTION

Figure 1:
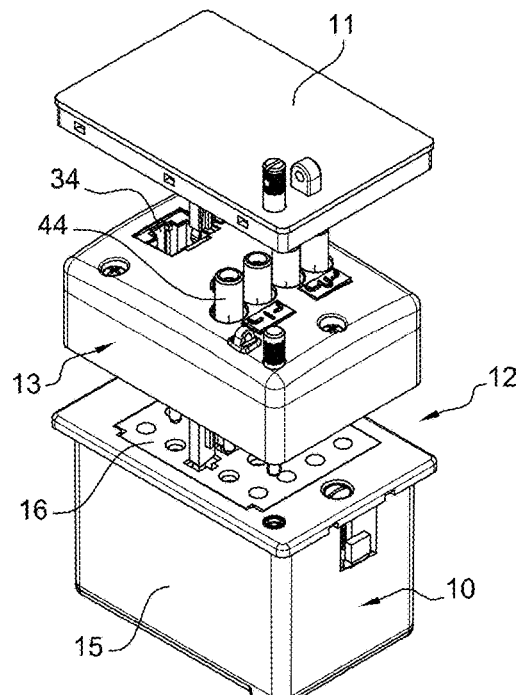
FIGS. 1 to 3 are perspective views of an example of the test appliance according to the invention, respectively substantially top, front and substantially bottom views.

With reference to the appended FIGS. 1 to 5 as summarized above, the invention essentially concerns a test block intended to be implanted in the circuit connecting an apparatus to be tested (not represented) and a power source (not represented) supplying the apparatus to be tested.

The power source may comprise a voltage sensor and/or an intensity sensor associated with a determined phase of an electric network while the apparatus to be tested may be an electricity meter or a protective relay intended to control at least one circuit breaker likely to act on this phase in case of overvoltage and/or overcurrent detected by the power source and by the protective relay.

The test block comprises a base 10 including a plurality of inner electric circuits independent of each other and allowing the transmission of information from the power source to the apparatus to be tested.

The inner electric circuits are intended to convey information distinct from one inner electric circuit to the other and representative, at each inner electric circuit, of a corresponding physical magnitude from the power source and to transmit to the apparatus to be tested when the inner electric circuits are closed. The nature and the arrangement of the inner electric circuits may be arbitrary and are not restrictive per se. A particular embodiment, but in no way restrictive, will be described below.

For example, it is possible to provide that two inner electric circuits allow the transmission of the measured value of the electric voltage from a phase of an electric network when the power source comprises a voltage sensor associated with this phase, to a protective relay when the apparatus to be tested comprises such a protective relay, likely to actuate a circuit breaker placed on this phase in case of overvoltage. Always by way of example, it is possible to provide that two other inner electric circuits allow the transmission of the measured value of the electric intensity from a phase of the electric network when the power source comprises an intensity sensor associated with this phase, to a protective relay when the apparatus to be tested comprises such a protective relay, likely to actuate a circuit breaker placed on this phase in case of overcurrent.

The test block also comprises a protective cover 11 intended to be assembled in a dismountable manner with the base 10 in order to form a closed enclosure in which the inner electric circuits are housed.

For this purpose, as represented, the base 10 may comprise a housing 15 which delimits an open cavity in which the inner electric circuits are implanted and the protective cover 11 sealingly closes this cavity when it is mounted on the base 10, in particular on the housing 15.

It may be advantageously ensured that the enclosure delimited by the base 10 and the protective cover 11 is sealed. The sealing of the enclosure conferred by the base 10 and the protective cover 11 in particular meets the standard IP40 when the cover 11 is fastened on the base 10. The base 10 and the protective cover 11 comprise all the means necessary to ensure this function.

The base 10 and the protective cover 11 are configured such that the removal of the protective cover 11 gives access to a receiving site 12 delimited by the base 10 and capable of receiving, by plugging, a test plug 13 independent of the test block and electrically linked to a test equipment (not represented). Depending on the nature of the test to be carried out, the test equipment may comprise a voltmeter and/or an ammeter and/or a dummy current source.

Figure 2:
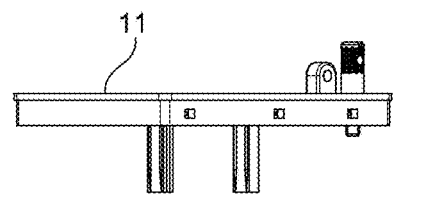
Figure 2:
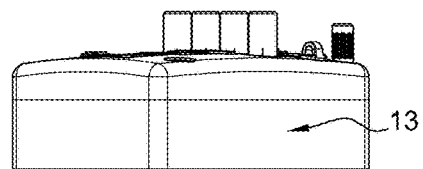
Figure 3:
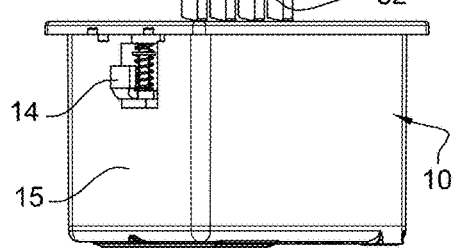
Figure 3:
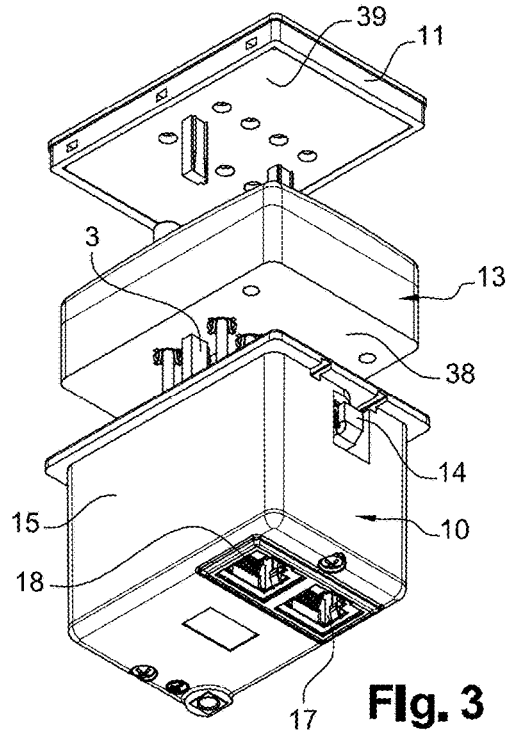

In FIGS. 1 to 3, it is well understood that either the protective cover 11 is fastened on the base 10, or the test plug 13 is fastened on the base 10, but the protective cover 11 is not intended to be fastened on the test plug 13.

The invention also concerns a test appliance comprising such a test block, but also the test plug 13 which is capable of being plugged into the receiving site 12 delimited by the base 10 after the removal of the protective cover 11.

The base 10 is intended to be fastened on an electric cabinet. The protective cover 11 defines a front face of the test block when it is mounted on the base 10 in that it is accessible from the outside of the electric cabinet when the test block is mounted on the electric cabinet. The base 10 of the test block comprises mounting elements 14 allowing fastening the test block on the metal cabinet, for example, as represented, a plurality of retaining tabs, each of which may be clamped by a screw dedicated to this operation.

The front face of the base 10, when the protective cover 11 is removed, is constituted by a front cover 16 provided with a plurality of rows of through holes. The front cover 16 is fastened on the housing 15 by any suitable means, in particular of the snap-fitting type.

The base 10 of the test block comprises at least one multi-contact type input socket 17 accessible from the outside of the enclosure and whose contacts are respectively electrically linked to the inner electric circuits so that the input socket 17 is connected to all inner electric circuits at the same time. The input socket 17 is configured so as to be able to be connected to a first multi-contact type connector (not represented) independent of the test block and whose contacts are electrically linked to the power source, in particular via a first multicore cable (not represented).

The base 10 of the test block also comprises at least one multi-contact type output socket 18 accessible from the outside of the enclosure and whose contacts are respectively electrically linked to the inner electric circuits so that the output socket 18 is connected to all inner electric circuits at the same time. The output socket 18 is configured so as to be able to be connected to a second multi-contact type connector (not represented) independent of the test block and whose contacts are electrically linked to the apparatus to be tested, in particular via a second multicore cable (not represented).

For the input socket 17 and for the output socket 18, each contact of the considered socket is linked to a single inner electric circuit and each inner electric circuit is linked to a single contact of this socket. Thus, each inner electric circuit of the test block is capable of electrically linking, when this inner electric circuit is closed, a single contact of the input socket 17 to a single contact of the output socket 18.

The electric connection between the contacts of the input 17 and output 18 sockets with the inner electric circuits of the test block can be made at a printed circuit 19, known under the acronym "PCB" for "Printed Circuit Board". The nature of the printed circuit 19 depends in particular on the nature of the sockets 17, 18 and on the nature of the inner electric circuits.

In this document, the term <<multiconductor>> means in particular that the concerned cable comprises a plurality of individually insulated electric conductors, and therefore insulated from each other. The term <<multi-contact>> means that the socket 17, 18 or the connector with which the socket 17, 18 cooperates comprises a plurality of individually insulated electric contacts, and therefore insulated from each other.

According to a particular embodiment giving a full satisfaction, the input socket 17 and the output socket 18 are each formed by a male or female connector of the RJ45 type, another common name of which is 8P8C (8 positions and 8 electric contacts), comprising a pinning with 8 contact positions, each of the pins corresponding to a contact of the concerned socket 17, 18.

This feature, even though advantageous and effective, is not restrictive. The means used to achieve the function presented above for the sockets 17, 18 may be arbitrary. It is for example possible to provide that the input socket 17 and the output socket 18 are each formed by a male or female connector of the USB type for <<Universal Serial Bus>>.

The base 10 and the protective cover 11 also comprise electrically conductive elements linked together and configured so as to ensure a continuity and a magnetic shielding closure such as the enclosure delimited by the base 10 and the protective cover 11 is a Faraday cage protecting the inner electric circuits vis-à-vis the magnetic fields external to the enclosure delimited by the base 10 and the protective cover 11.

The base 10 comprises a removable lid 20 whose removal relative to the rest of the base 10 gives access to the inner electric circuits and whose nature and/or shape is adapted to the nature of the input and output sockets 17, 18. The fastening of the removable lid 20 to the housing 15 may be made, for example, via screws 21. Another advantage is to be able to adapt the removable lid 20 depending on the nature of the input and output sockets 17, 18 and on the printed circuit 19 while using a housing 15 common to the different variants of bases 10 obtained thereby by replacing or substituting the input and output sockets 17, 18, of the removable lid 20 and of the printed circuit 19.

The removable lid 20 therefore comprises a portion of the electrically conductive elements constituting the Faraday cage. The same applies to the housing 15 and to the protective cover 11.

The removable lid 20 is fastened on the housing 15 so as to define the rear face of the base 10, that is to say the face opposite the front face receiving the protective cover 11 and intended to be turned towards the inside of the electric cabinet. The removable lid 20 comprises openings allowing the input socket 17 and the output socket 18 to be accessible from the outside of the test block on the side of the rear face of the base 10. However, it is still possible to consider that the input socket 17 and/or the output socket 18 may open outwardly from the base 10 at a side face of the base 10, that is to say a side face of the housing 15 which joins the removable lid 20 to the protective cover 11.

Moreover, the test block comprises electrically conductive elements (not represented) linking the electrically conductive elements constituting the Faraday cage to the metal cabinet when the base 10 is mounted on the electric cabinet via the mounting elements 14. Thus, the Faraday cage is electrically linked to the metal of the metal cabinet.

According to a particular embodiment, on all or part of the surface of the outer walls of the base 10, these outer walls are internally and/or externally covered, or constituted, by at least one aluminum panel.

By way of example, the outer walls of the base 10 are externally covered or constituted by aluminum forming a closed continuous panel. For example, it is possible to provide that 5 of the 6 walls of the housing 15 are covered with aluminum so that the lid closes the aluminum parallelepiped of the Faraday cage.

In particular, on all or part of the surface of the outer walls of the removable lid 20, these outer walls are internally and/or externally covered, or constituted, by at least one aluminum panel.

By way of example, the outer walls of the lid 20 are externally covered or constituted by aluminum forming a closed continuous panel. In particular, the outer face and/or the inner face of the main outer wall of the removable lid are covered with aluminum, knowing that the 4 faces of the slice are also with aluminum.

In parallel, on all or part of the surface of the outer walls of the protective cover 11, these outer walls are internally and/or externally covered, or constituted, by at least one aluminum panel.

By way of example, the outer walls of the protective cover 11 are internally covered by a one piece aluminum panel 39 (shown in FIG. 3) facing the front cover 16 when the protective cover 11 is fastened on the base 10.

It is understood that the aluminum panels present at the base 10 and at the protective cover 11 are all connected together so as to form the Faraday cage.

The inner electric circuits of the test block and of the test plug 13 are configured such that the plugging of the test plug 13 causes a temporary action on all or part of the inner electric circuits of the test block as long as the test plug 13 is plugged, this temporary action being such that it allows carrying out measuring and/or calibrating operations vis-à-vis the apparatus to be tested thanks to the test equipment.

Figure 4:
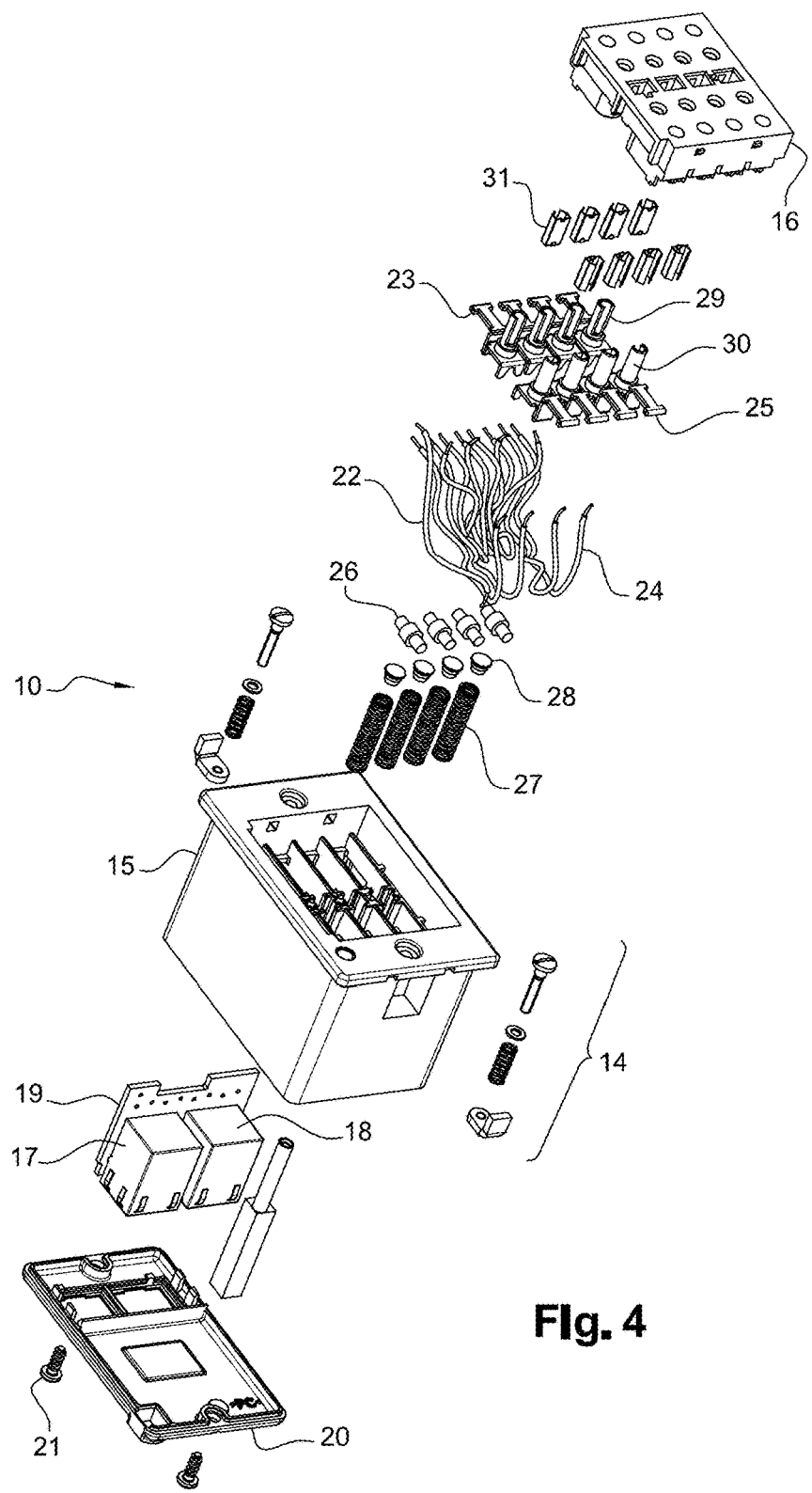
FIG. 4 is an exploded view of the base of the test block of FIGS. 1 to 3.

According to an embodiment as represented in FIG. 4, effective but not restrictive per se, each inner electric circuit of the test block comprises a first electric conductor 22 electrically linked to a contact of the input socket 17 and to a first contact strip 23. Each inner electric circuit also comprises a second electric conductor 24 electrically linked to a contact of the output socket 18 and to a second contact strip 25. The two contact strips 23, 25 may be electrically connected, or disconnected, depending on the position occupied by a movable contact 26 adopting, for example, the shape of a roller and biased by a pressure spring 27 towards the position conferring the contact between the two strips 23, 25. The interface between the pressure spring 27 and the movable contact 26 is made by a pellet 28 mounted at the movable end of the pressure spring 27 whose fixed end comes into contact with the housing 15.

According to this mounting, each inner electric circuit is closed as long as the movable contact 26 is in contact with the two strips 23, 25 under the effect of the spring 27. This corresponds to the naturally occupied configuration as long as the test plug 13 is not plugged into the receiving site 12 delimited by the base 10. On the contrary, a forced displacement of the movable contact 26 in opposition to the action of the spring 27 causes the opening of the inner electric circuit, in that this displacement of the movable contact 26 induces that the two contact strips 23, 25 are no longer in direct electric contact.

The first contact strip 23 comprises a test pad 29 and the second contact strip 25 comprises a test pad 30, whose operation will be explained below. Each test pad 29, 30 comprises a contact spring 31.

All inner electric circuits constituted thereby are housed in the housing 15 of the base 10 and the front cover 16 covers and protects the components of the inner electric circuits.

The front cover 16 comprises:
  a first row of through holes, in which each through hole is located in vertical alignment with one of the first contact strips 23,
  a second row of through holes, in which each through hole is located in vertical alignment with one of the test pads 29,
  a third row of through holes, in which each through hole is located in vertical alignment with one of the movable contacts 26,
  a fourth row of through holes, in which each through hole is located in vertical alignment with one of the test pads 30,
  and a fifth row of through holes, in which each through hole is located in vertical alignment with one of the second contact strips 25.

Figure 5:
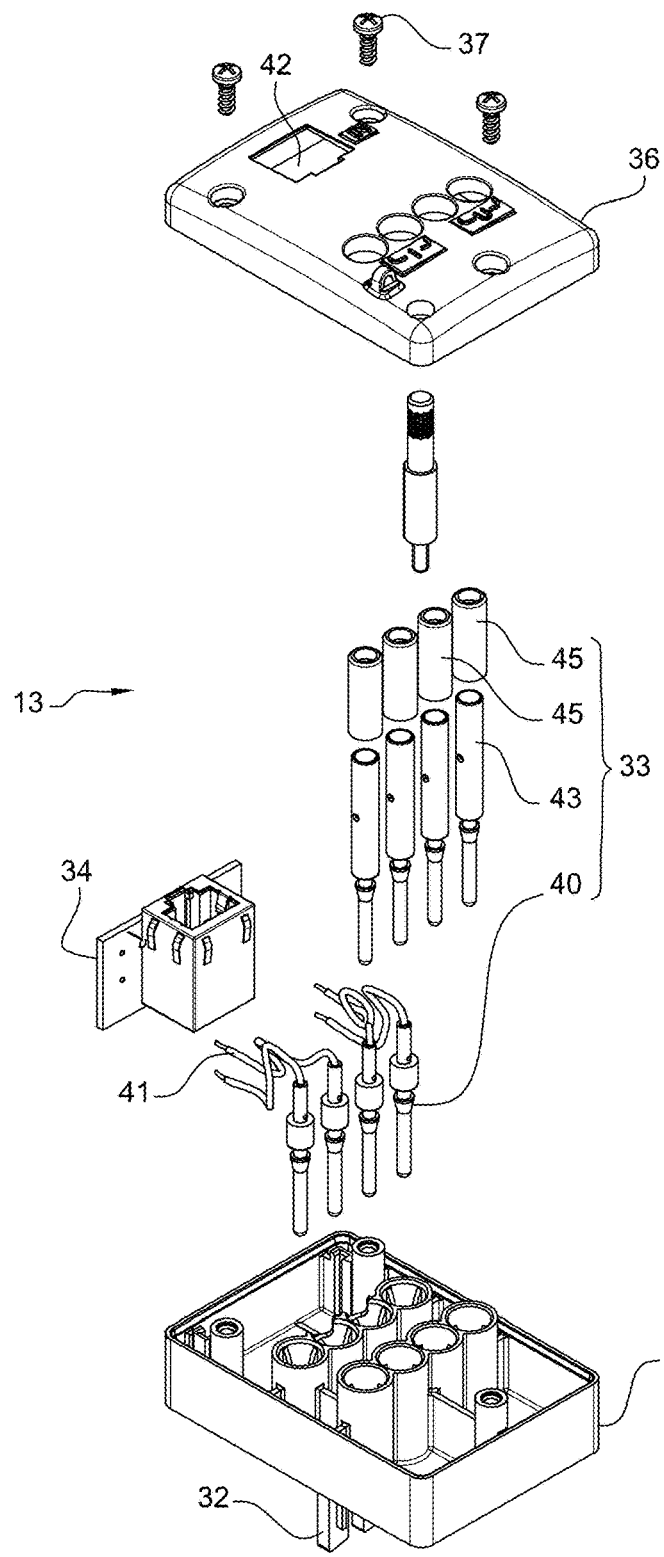
FIG. 5 is an exploded view of the test plug shown in FIGS. 1 to 3.

According to a particular embodiment and now with reference to FIGS. 2 and 5, the test plug 13 comprises, on the one hand, a plurality of actuating elements 32 and a plurality of electric conductors 33 configured so as to act on the inner electric circuits of the base 10 in a manner causing the temporary action which has been previously mentioned as long as the test plug 13 is plugged into the receiving site 12 delimited by the base 10.

The test plug 13 comprises, on the other hand, a multi-contact type output socket 34 whose contacts are respectively connected to all or part of the electric conductors 33, the output socket 34 of the test plug 13 being configured so as to be able to be connected to a third multi-contact type connector (not represented) independent of the test block and of the test plug 13 and whose contacts are electrically linked to the test equipment, in particular via a third multicore cable (not represented).

According to a particular embodiment, the test plug 13 comprises a housing obtained by joining a support 35 delimiting a cavity and a lid 36 enclosing this cavity. The output socket 34 of the test plug 13 is housed in this cavity and opens outwardly from the housing through an opening 42 formed in the lid 36. The lid 36 is fastened on the support 35 by any possible mechanical means, such as for example via a plurality of screws 37. The lid 36 is located on the front face of the test plug 13 whose rear face 38 is intended to come against the front face of the base 10 (more precisely opposite the front cover 16) once the protective cover 11 was removed.

It is specified here that the actuating elements 32 may be constituted by rods protruding from the rear face 38 of the test plug 13, to the outside of the support 35, and capable of being each inserted into a through hole of the third row of through holes formed in the front cover 16. Their height is such that the total insertion of these rods obtained when contacting the rear face 38 of the test plug 13 with the base 10 causes the displacement of the movable contacts 26 in opposition to the action of the pressure springs 27 and induces the opening of the inner electric circuits whose movable contact 26 has been displaced.

As represented in FIG. 5, some electric conductors 33 of the test plug 13 each comprise a pin 40 capable of protruding from the rear face 38 to the outside of the support 35. Each pin 40 is capable of being inserted into a through hole of the fourth row of through holes formed in the front cover 16 and of being plugged into one of the test pads 30 and is electrically linked to one of the contacts of the output socket 34 via a conductive wire 41.

In addition to the multi-contact type output socket 34, the test plug 13 may also comprise a plurality of output sockets 44 each of the mono-contact type and the other electric conductors 33 of the test plug 13 each comprise a pin 43 protruding from the rear face 38 to the outside of the support 35. Each pin 43 is capable of being inserted into a through hole of the second row of through holes formed in the front cover 16 and of being plugged into one of the test pads 29 and is electrically linked to the single contact of one of the mono-contact output sockets 44. An insulating cap 45 is positioned about a portion of the pin 43.

When the test plug 13 is plugged into the receiving site 12 delimited by the base 10, the electric conductors 33 which are connected to the contacts of the output socket 34 of the test plug 13 are plugged into the test pads 30 via the pins 40 and are then electrically linked to all or part of the contacts of the output socket 18 of the base 10 of the test block via all or part of the inner electric circuits, in particular via the second strips 25 and via the electric conductors 24. At the same time, the electric conductors 33 which are connected to the contacts of the output sockets 44 of the test plug 13 are plugged into the test pads 29 via the pins 43 and are then electrically linked to all or part of the contacts of the input socket 17 of the base 10 of the test block via all or part of the inner electric circuits, in particular via the first strips 23 and via the electric conductors 22.

In the illustrated example, the actuating elements 32, the electric conductors 33 and the arrangement of the inner electric circuits of the base 10 are arranged so as to operate according to a test principle with short-circuited contacts. Thus, the inner electric circuit is automatically short-circuited when the test plug 13 is plugged. In normal operation, the base 10 ensures the electric continuity as long as the protective cover 11 is mounted on the base 10. At the moment of the test, the cover 11 is removed. When plugging the test plug 13, the pins 40, 43 of the test plug 13 first come into contact with the test pads 29, 30 of the base 10 in order to establish the test circuit via the electric conductors 33. It is only when the test plug 13 is completely inserted into the base 10 that the movable contact 26 opens the contact between the contact strips 23, 25 in order to fully bypass the current via the electric conductors 33. At the moment of the return to service at the end of the test, thanks to the movable contact 26 biased by the pressure spring 27, the inner electric circuit closes automatically when the test plug 13 is disconnected from the base 10.

However, this feature is not restrictive and it is possible to provide an arrangement of the test plug 13 and of the base 10 such that they operate according to an test principle with open contacts (the inner electric circuit is open when the protective cover 11 is removed and the apparatus to be tested is then no longer supplied) or according to a test principle with closed contacts (the electric connection being permanent, the inner electric circuit remains closed during the test).

The output socket of the test plug 13 is formed by a male or female connector of the RJ45 type comprising a pinning with 8 contact positions, each of the pins corresponding to a contact of the output socket of the test plug.

The test appliance comprises the aforementioned first connector, which is of the multi-contact type, independent of the test block and of the test plug 13, complementary to the input socket 17 of the test block so as to able to be connected to the input socket 17 of the test block and whose contacts are electrically linked to the power source, in particular via the first multicore cable. The input socket 17 of the test block and the first connector are configured such that the electric connection between the inner electric circuits of the test block and the power source results from the action of connecting the first connector with the input socket 17 of the test block. The first connector may in particular be of the RJ45 type and have a nature which is complementary to that of the input socket 17.

According to a particular embodiment, the electrically conductive elements constituting the Faraday cage are linked to the shield of the first multicore cable.

The test appliance also comprises the aforementioned second connector, which is of the multi-contact type, independent of the test block and of the test plug 13, complementary to the output socket 18 of the test block so as to be able to be connected to the output socket 18 of the test block and whose contacts are electrically linked to the apparatus to be tested, in particular via the second multicore cable. The output socket 18 of the test block and the second connector are configured such that the electric connection between the inner electric circuits and the apparatus to be tested results from the action of connecting the second connector with the output socket 18 of the test block. The second connector may in particular be of the RJ45 type and have a nature which is complementary to that of the output socket 18.

Advantageously, the electrically conductive elements constituting the Faraday cage are linked to the shield of the second multicore cable.

Finally, the test appliance comprises the aforementioned third multi-contact type connector, which is independent of the test block and of the test plug, complementary to the output socket 34 of the test plug 13 so as to be able to be connected to the output socket 34 of the test plug 13 and whose contacts are electrically linked to the test equipment, in particular via the third multicore cable. The output socket 34 of the test plug 13 and the third connector are configured such that the electric connection of the electric conductors 33 of the test plug 13 to the test equipment results from the action of connecting the third connector in the output socket 34 of the test plug 13. The third connector may in particular be of the RJ45 type and have a nature which is complementary to that of the output socket 34.

The test block which has just been described is simple, robust, easy and convenient to use and cost-effective. The number of sockets is small and it is necessary to manipulate few electric connectors, which strengthens its reliability by providing a limited number of parts. Moreover, the reliability and the quality of measurements and calibrations are very good, as well as the safety.

What is claimed is:

1. A test block intended to be implanted in the circuit connecting an apparatus to be tested such as an electricity meter or a protective relay and a power source supplying the apparatus to be tested such as an intensity sensor and/or a voltage sensor, the test block comprising:
   a base including a plurality of inner electric circuits capable of allowing the transmission of information from the power source to the apparatus to be tested,
   a protective cover intended to be assembled in a dismountable manner with the base in order to form a closed enclosure in which the inner electric circuits are housed,
   the base and the protective cover being configured such that the removal of the protective cover gives access to a receiving site delimited by the base and capable of receiving by plugging a test plug independent of the test block and electrically linked to a test equipment, in particular a voltmeter and/or an ammeter and/or a dummy current source, the test block being characterized in that the base comprises:
   at least one multi-contact type input socket accessible from the outside of the enclosure and whose contacts are respectively electrically linked to inner electric circuits so that the input socket is connected to all inner electric circuits at the same time, the input socket being configured so as to be able to be connected to a first multi-contact type connector independent of the test block and whose contacts are electrically connected to the power supply, in particular via a multicore cable,
   and at least one multi-contact type output socket accessible from the outside of the enclosure and whose contacts are respectively electrically linked to the inner electric circuits so that the output socket is connected to all inner electric circuits at the same time, the output socket being configured so as to be able to be connected to a second multi-contact type connector independent of the test block and whose contacts are electrically linked to the apparatus to be tested, in particular via a multicore cable.

2. The test block according to claim 1, characterized in that the base and the protective cover comprise electrically conductive elements linked to each other and configured so as to ensure a continuity and a magnetic shielding closure such as the enclosure delimited by the base and the protective cover is a Faraday cage protecting the inner electric circuits relative to the magnetic fields external to the enclosure delimited by the base and the protective cover.

3. The test block according to claim 1, characterized in that the base comprises a removable lid whose removal relative to the rest of the base gives access to the inner electric circuits and whose nature and/or shape is adapted to the nature of the input and output sockets.

4. A test appliance comprising a test block according to claim 1 further comprising a test plug capable of being plugged into the receiving site delimited by the base after removal of the protective cover, the inner electric circuits of the test block and the test plug being configured such that the plugging of the test plug causes a temporary action on all or part of the inner electric circuits of the test block as long as the test plug is plugged, said temporary action being such as it allows carrying out measuring and/or calibrating operations in relation with the apparatus to be tested thanks to the test equipment.

5. The test appliance according to claim 4, characterized in that it comprises a first multi-contact type connector independent of the test block and of the test plug, complementary to the input socket of the test block so as to be able to be connected to the input socket of the test block and whose contacts are electrically linked to the power source, in particular via a multicore cable, and in that the input socket of the test block and the first connector are configured such that the electric connection between the inner electric circuits of the test block and the power source results from the action of connecting the first connector with the input socket of the test block.

6. The test appliance according to claim 4, characterized in that it comprises a second multi-contact type connector independent of the test block and of the test plug, complementary to the output socket of the test block so as to be able to be connected to the output socket of the test block and whose contacts are electrically linked to the apparatus to be tested, in particular via a multicore cable, and in that the output socket of the test block and the second connector are configured such that the electric connection between the inner electric circuits and the apparatus to be tested results from the action of connecting the second connector with the output socket of the test block.

7. The test appliance according to claim 4, characterized in that the test plug comprises, on the one hand, a plurality of actuating elements and a plurality of electric conductors configured so as to act on the inner electric circuits of the base in a manner causing said temporary action as long as the test plug is plugged into the receiving site delimited by the base and, on the other hand, a multi-contact type output socket whose contacts are respectively connected to all or part of the electric conductors of the test plug, the output socket of the test plug being configured so as to be able to be connected to a third multi-contact type connector independent of the test block and of the test plug and whose contacts are electrically linked to the test equipment, in particular via a multicore cable.

8. The test appliance according to claim 7, characterized in that when the test plug is plugged into the receiving site delimited by the base, the electric conductors which are connected to the contacts of the output socket of the test plug are electrically linked to all or part of the contacts of the output socket of the base of the test block via all or part of the inner electric circuits.

9. The test appliance according to claim 7, characterized in that the output socket of the test plug is formed by a male or female connector of the RJ45 type comprising a pinning with 8 contact positions, each of the pins corresponding to a contact of the output socket of the test plug.

10. The test appliance according to claim 7, characterized in that it comprises the third multi-contact type connector independent of the test block and of the test plug, complementary to the output socket of the test plug so as to be able to be connected to the output socket of the test plug and whose contacts are electrically linked to the test equipment, in particular via a multicore cable and in that the output socket of the test plug and the third connector are configured such that the electric connection of the electric conductors of the test plug to the test equipment results from the action of connecting the third connector in the output socket of the test plug.

11. The test block according to claim 2, characterized in that the base comprises a removable lid whose removal relative to the rest of the base gives access to the inner electric circuits and whose nature and/or shape is adapted to the nature of the input and output sockets.

12. A test appliance comprising a test block according to claim 11 further comprising a test plug capable of being plugged into the receiving site delimited by the base after removal of the protective cover, the inner electric circuits of the test block and the test plug being configured such that the plugging of the test plug causes a temporary action on all or part of the inner electric circuits of the test block as long as the test plug is plugged, said temporary action being such as it allows carrying out measuring and/or calibrating operations in relation with the apparatus to be tested thanks to the test equipment.

13. A test appliance comprising a test block according to claim 2 further comprising a test plug capable of being plugged into the receiving site delimited by the base after removal of the protective cover, the inner electric circuits of the test block and the test plug being configured such that the plugging of the test plug causes a temporary action on all or part of the inner electric circuits of the test block as long as the test plug is plugged, said temporary action being such as it allows carrying out measuring and/or calibrating operations in relation with the apparatus to be tested thanks to the test equipment.

14. A test appliance comprising a test block according to claim 3 further comprising a test plug capable of being plugged into the receiving site delimited by the base after removal of the protective cover, the inner electric circuits of the test block and the test plug being configured such that the plugging of the test plug causes a temporary action on all or part of the inner electric circuits of the test block as long as the test plug is plugged, said temporary action being such as it allows carrying out measuring and/or calibrating operations in relation with the apparatus to be tested thanks to the test equipment.

15. The test appliance according to claim 12, characterized in that it comprises a first multi-contact type connector independent of the test block and of the test plug, complementary to the input socket of the test block so as to be able to be connected to the input socket of the test block and whose contacts are electrically linked to the power source, in particular via a multicore cable, and in that the input socket of the test block and the first connector are configured such that the electric connection between the inner electric circuits of the test block and the power source results from the action of connecting the first connector with the input socket of the test block.

16. The test appliance according to claim 13, characterized in that it comprises a first multi-contact type connector independent of the test block and of the test plug, complementary to the input socket of the test block so as to be able to be connected to the input socket of the test block and whose contacts are electrically linked to the power source, in particular via a multicore cable, and in that the input socket of the test block and the first connector are configured such that the electric connection between the inner electric circuits of the test block and the power source results from the action of connecting the first connector with the input socket of the test block.

17. The test appliance according to claim 14, characterized in that it comprises a first multi-contact type connector independent of the test block and of the test plug, complementary to the input socket of the test block so as to be able to be connected to the input socket of the test block and whose contacts are electrically linked to the power source, in particular via a multicore cable, and in that the input socket of the test block and the first connector are configured such that the electric connection between the inner electric circuits of the test block and the power source results from the action of connecting the first connector with the input socket of the test block.

18. The test appliance according to claim 17, characterized in that it comprises a second multi-contact type connector independent of the test block and of the test plug, complementary to the output socket of the test block so as to be able to be connected to the output socket of the test block and whose contacts are electrically linked to the apparatus to be tested, in particular via a multicore cable, and in that the output socket of the test block and the second connector are configured such that the electric connection between the inner electric circuits and the apparatus to be tested results from the action of connecting the second connector with the output socket of the test block.

19. The test appliance according to claim 18, characterized in that the test plug comprises, on the one hand, a plurality of actuating elements and a plurality of electric conductors configured so as to act on the inner electric circuits of the base in a manner causing said temporary action as long as the test plug is plugged into the receiving site delimited by the base and, on the other hand, a multi-contact type output socket whose contacts are respectively connected to all or part of the electric conductors of the test plug, the output socket of the test plug being configured so as to be able to be connected to a third multi-contact type connector independent of the test block and of the test plug and whose contacts are electrically linked to the test equipment, in particular via a multicore cable.

20. The test appliance according to claim 19, characterized in that when the test plug is plugged into the receiving site delimited by the base, the electric conductors which are connected to the contacts of the output socket of the test plug are electrically linked to all or part of the contacts of the output socket of the base of the test block via all or part of the inner electric circuits.

* * * * *